(12) United States Patent
Takasu

(10) Patent No.: US 6,441,461 B1
(45) Date of Patent: Aug. 27, 2002

(54) THIN FILM RESISTOR WITH STRESS COMPENSATION

(75) Inventor: Hiroaki Takasu, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/698,682

(22) Filed: Oct. 27, 2000

(30) Foreign Application Priority Data

Feb. 7, 2000 (JP) ......................................... 2000-028792

(51) Int. Cl.[7] .............................................. H01L 29/00
(52) U.S. Cl. ...................... 257/538; 257/536; 257/537; 438/382; 438/384
(58) Field of Search ................................ 257/536, 537, 257/538; 438/382, 384

(56) References Cited

U.S. PATENT DOCUMENTS 6,215,353 B1 * 4/2001 Lewyn .......................... 327/538
6,242,314 B1 * 6/2001 Chen et al. ................... 438/384
6,261,915 B1 * 7/2001 Eklund et al. ............... 438/384

* cited by examiner

Primary Examiner—Richard Elms
Assistant Examiner—Christian D. Wilson
(74) Attorney, Agent, or Firm—Adams & Wilks

(57) ABSTRACT

A thin film resistor element which maintains its resistance value when stress is applied such as during packaging, so that the resistor element may be used in a high precision bleeder resistor circuit to maintain an accurate voltage dividing ratio. The thin film resistor element has a P-type thin film resistor formed of a P-type semiconductor thin film and an N-type thin film resistor formed of an N-type semiconductor thin film, so that a change in resistance value when stress is applied is prevented. In a bleeder resistor circuit, a resistance value of one unit is regulated by a resistance value formed by a combination of the P-type thin film resistor and the N-type thin film resistor so that, even in the case where stress is applied, a change in resistance values of the respective resistor elements cancel out each other and an accurate voltage dividing ratio can be maintained.

13 Claims, 2 Drawing Sheets

THIN FILM RESISTOR WITH STRESS COMPENSATION

BACKGROUND OF THE INVENTION

1. Field of the Invention

The present invention relates to a semiconductor device, and particularly to a semiconductor device including a thin film resistor, a bleeder resistor circuit using a thin film resistor, and a semiconductor device including the bleeder resistor circuit.

2. Description of the Related Art

Although a number of resistors formed of semiconductor thin films of polysilicon or the like, and a number of bleeder resistor circuits using those resistors have been conventionally used, the known resistor is made of a semiconductor thin film of either one of an N type and a P type.

However, in the conventional thin film resistor, in the case where stress is applied to the thin film resistor, for example, in the case where it is resin packaged, there has been a problem that its resistance value is changed, and in the bleeder resistor circuit, a voltage dividing ratio is often changed after resin packaging.

SUMMARY OF THE INVENTION

The present invention has been made to solve the foregoing problem and has an object to provide semiconductor device including a thin film resistor which can keep an initial resistance value even after packaging, a high precision bleeder resistor circuit which can keep an accurate voltage dividing ratio even after packaging, and a high precision semiconductor device using such a bleeder resistor circuit, for example, a voltage detector, a voltage regulator, or the like.

In order to achieve the above object, according to the present invention, a thin film resistor or a thin film resistor of a bleeder resistor circuit using thin film resistors is constituted by a P-type thin film resistor made of a P-type semiconductor thin film and an N-type thin film resistor made of an N-type semiconductor thin film. Further, in the bleeder resistor circuit, a resistance value of one unit is regulated by a resistance value formed by a combination of the P-type thin film resistor and the N-type thin film resistor, so that changes of resistance values in the P-type thin film resistor and the N-type thin film resistor by a piezo effect described below cancel out each other.

The changes of the resistance values by the piezo effect and the influence on the bleeder resistor circuit will be described below.

In the case where stress is applied to the thin film resistor, although the resistance value of the thin film resistor is changed by the so-called piezo effect, the directions of the changes of the resistance values become opposite between the P-type thin film resistor and the N-type thin film resistor. This is also ascertained through experiments by the present inventor. For example, the resistance value of the P-type thin film resistor is decreased, and the resistance value of the N-type thin film resistor is increased (the directions of the changes depend on the direction of the stress).

When an IC is resin packaged, stress is generated so that the resistance value of the thin film resistor is changed by the piezo effect as described above. Although the bleeder resistor circuit is for obtaining an accurate voltage dividing ratio, the resistance values of the respective resistors are changed so that the voltage dividing ratio is also changed.

Since the thin film resistor of the present invention is constituted by the P-type thin film resistor made of the P-type semiconductor thin film and the N-type thin film resistor made of the N-type semiconductor thin film, even in the case where the stress is applied, a change in the resistance value can be prevented. Besides, in the bleeder resistor circuit, since the resistance value of one unit is regulated by the resistance value formed by a combination of the P-type thin film resistor and the N-type thin film resistor, even in the case where stress is applied, the changes in resistance value of the respective resistors cancel each other out, and accurate voltage dividing ratio can be maintained.

Since the thin film resistor of the semiconductor device of the present invention is constituted by the P-type thin film resistor made of the P-type semiconductor thin film and the N-type thin film resistor made of the N-type semiconductor thin film, even in the case where stress is applied by resin packaging or the like, the changes of the resistance values of the respective resistors cancel out each other and the initial resistance value can be kept. Besides, in the bleeder resistor circuit, since the resistance value of one unit is regulated by a resistance value formed by a combination of the P-type thin film resistor and the N-type thin film resistor, an accurate voltage dividing ratio can be kept. By using such a bleeder resistor circuit, a high precision semiconductor device, for example, a voltage detector, a voltage regulator, or the like can be obtained.

DETAILED DESCRIPTION OF THE PREFERRED EMBODIMENTS

Preferred embodiments of the present invention will be described below with reference to the drawings.

Figure 1:
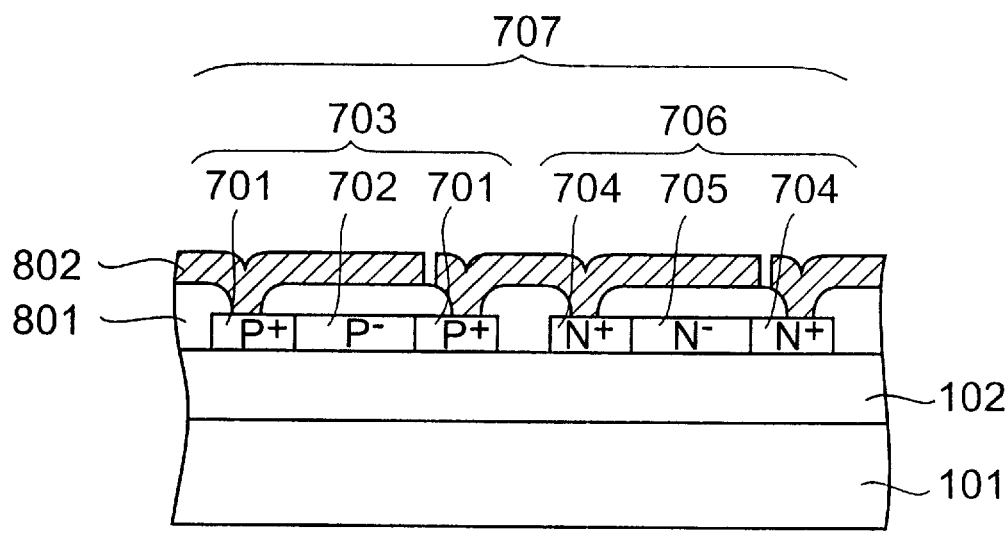
FIG. 1 is a schematic sectional view showing an embodiment of a semiconductor thin film resistor of a semiconductor device of the present invention.

FIG. 1 is a schematic sectional view showing an embodiment of a semiconductor thin film resistor of a semiconductor device of the present invention.

A first insulating film 102 is formed on a semiconductor substrate 101, and on the first insulating film 102, there are formed a P-type polysilicon resistor 703 including a P-type high resistance region 702 sandwiched between P-type low resistance regions 701 containing a P-type impurity of high concentration for electrical connection with a wiring line 802, and an N-type polysilicon resistor 706 including an N-type high resistance region 705 sandwiched between N-type low resistance regions 704 containing an N-type impurity of high concentration for electrical connection with the wiring line 802. The P-type low resistance regions 701 and the N-type low resistance regions 704 are respectively connected with the wiring line 802 made of aluminum. Here, a resistance value of a resistor 707 obtained by combining the P-type polysilicon resistor 703 and the N-type polysilicon resistor 706 can keep an initial resistance value even in the case where stress is applied by resin packaging or the like, since the change of the resistance value of the P-type polysilicon resistor 703 and the change of the resistance value of the N-type polysilicon resistor 706 can cancel out each other.

In FIG. 1, although the example in which the one P-type polysilicon resistor 703 and the one N-type polysilicon resistor 706 are combined has been described, the resistor 707 may be formed by combining a plurality of P-type polysilicon resistors 703 and N-type polysilicon resistors 706.

Besides, the resistor 707 obtained by combining the P-type polysilicon resistor 703 and the N-type polysilicon resistor 706 shown in FIG. 1 is regulated as one unit of a bleeder resistor circuit, and when a plurality of such resistors 707 are formed to constitute the entire bleeder resistor circuit, even in the case where stress is applied by resin packaging or the like, an accurate voltage dividing ratio can be kept. By using such a bleeder resistor circuit, a high precision semiconductor device, for example, a voltage detector, a voltage regulator, or the like can be obtained.

Figure 2:
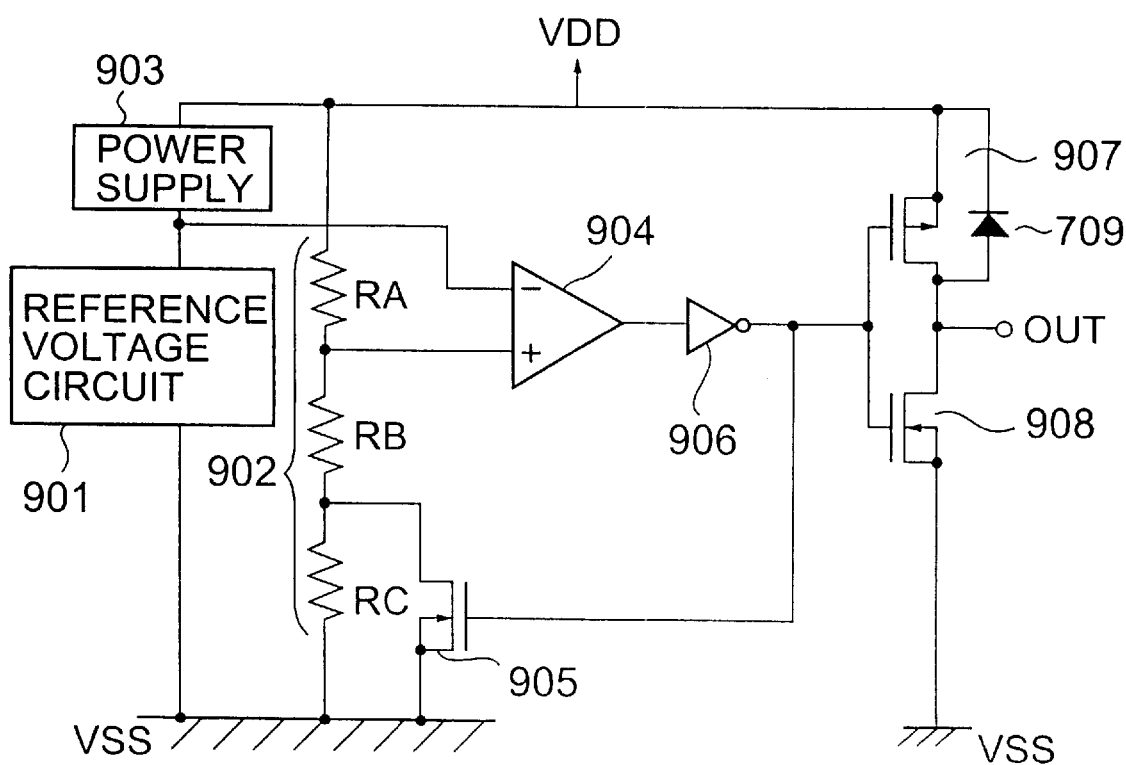
FIG. 2 is a block diagram showing an embodiment of a voltage detector using a bleeder resistor circuit of the present invention.

FIG. 2 is a block diagram showing an embodiment of a voltage detector using a bleeder resistor circuit of the present invention.

Although an example of a simple circuit is shown for simplification, functions may be added to an actual product as the need arises.

Basic structural circuit elements of the voltage detector include a current source 903, a reference voltage circuit 901, a bleeder resistor circuit 902, and an error amplifier 904. In addition, an inverter 906, N-type transistors 905 and 908, a P-type transistor 907, and the like are added. Apart of the operation will be described below in brief.

When VDD is a predetermined release voltage or more, the N-type transistors 905 and 908 are turned OFF, and the P-type transistor 907 is turned ON, so that VDD is outputted as output OUT.

At this time, the input voltage of the error amplifier 904 becomes $(RB+RC)/(RA+RB+RC)*VDD$.

When VDD is lowered and becomes less than a detection voltage, VSS is outputted as the output OUT. At this time, the N-type transistor 905 is turned ON, and the input voltage of the error amplifier 904 becomes $RB/(RA+RB)*VDD$.

Like this, the basic operation is performed by comparing a reference voltage generated in the reference voltage circuit 901 with a voltage divided by the bleeder resistor circuit 902 through the error amplifier 904. Thus, the precision of the voltage divided by the bleeder resistor circuit 902 becomes very important. If the voltage dividing precision of the bleeder resistor circuit 902 is poor, the input voltage to the error amplifier 904 fluctuates, and it becomes impossible to obtain a predetermined release or detection voltage. By using the bleeder resistor circuit of the present invention, high precision voltage dividing becomes possible even after an IC is resin packaged, so that the yield of a product as the IC is improved and it becomes possible to manufacture a higher precision voltage detector.

Figure 3:
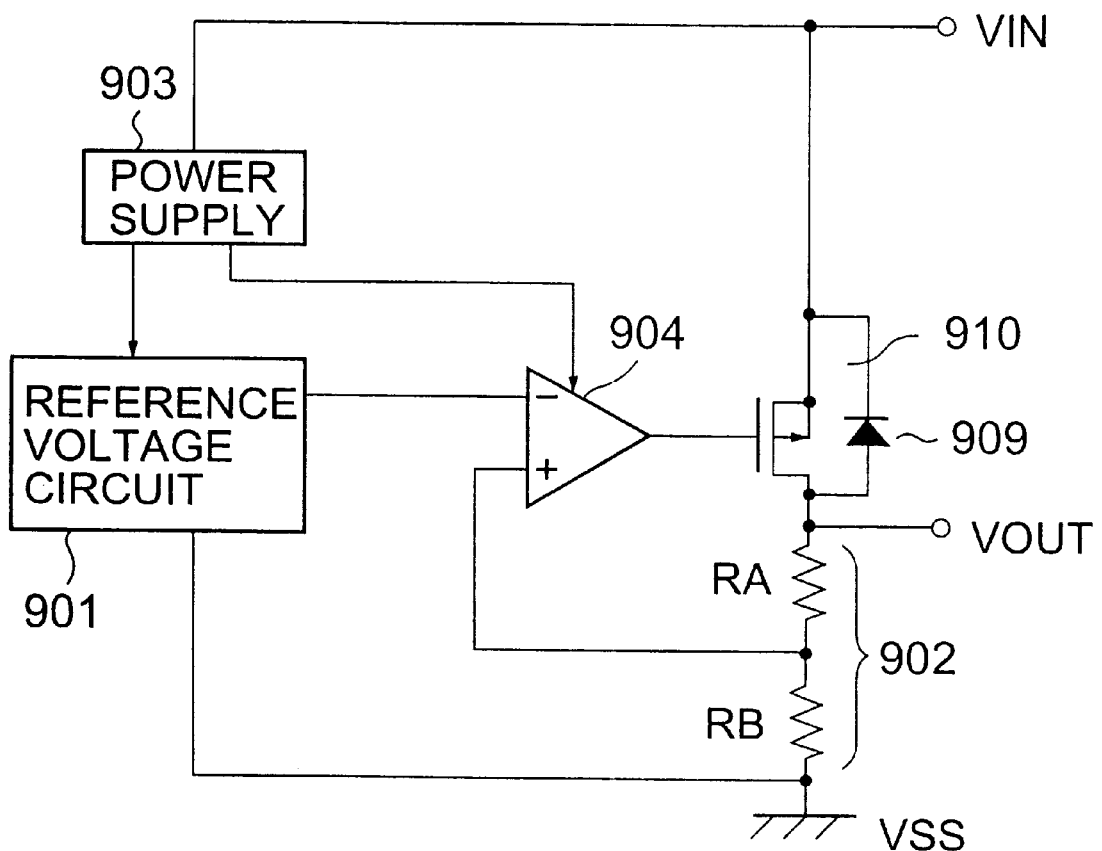
FIG. 3 is a block diagram showing an embodiment of a voltage regulator using a bleeder resistor circuit of the present invention.

FIG. 3 is a block diagram showing an embodiment of a voltage regulator using a bleeder resistor circuit of the present invention.

Although an example of a simple circuit is shown for simplification, functions may be added to an actual product as the need arises.

Basic structural circuit elements of the voltage regulator include a current source 903, a reference voltage circuit 901, a bleeder resistor circuit 902, an error amplifier 904, a P-type transistor 910 functioning as a current control transistor, and the like. A part of the operation will be described below in brief.

The error amplifier 904 compares a voltage divided by the bleeder resistor circuit 902 with a reference voltage generated by the reference voltage circuit 901, and supplies, to the P-type transistor 910, a gate voltage necessary for obtaining a constant output voltage VOUT which does not receive an influence of an input voltage VIN or temperature change. In the voltage regulator as well, similarly to the case of the voltage detector explained in FIG. 2, the basic operation is performed by comparing the reference voltage generated by the reference voltage circuit 901 with the voltage divided by the bleeder resistor circuit 902 through the error amplifier 904. Thus, the precision of the voltage divided by the bleeder resistor circuit 902 becomes very important. If the voltage dividing precision of the bleeder resistor circuit 902 is poor, the input voltage to the error amplifier 904 fluctuates, and it becomes impossible to obtain the predetermined output voltage VOUT. By using the bleeder resistor circuit of the present invention, voltage dividing with high precision becomes possible even after an IC is resin packaged, so that the yield of a product as the IC is improved, and it becomes possible to manufacture a higher precision voltage regulator.

As described above, since the thin film resistor of the semiconductor device of the present invention is constituted by the P-type thin film resistor made of the P-type semiconductor thin film and the N-type thin film resistor made of the N-type semiconductor thin film, even in the case where stress is applied by resin packaging or the like, the changes of the resistance values of the respective resistors cancel out each other, and the initial resistance value can be kept. Besides, in the bleeder resistor circuit, since the resistance value of one unit is regulated by the resistance value formed by the combination of the P-type thin film resistor and the N-type thin film resistor, an accurate voltage dividing ratio can be kept. By using such a bleeder resistor circuit, there is an effect that a high precision semiconductor device, for example, a voltage detector, a voltage regulator, or the like can be obtained.

What is claimed is:

1. A semiconductor device having a thin film resistor element, the thin film resistor element comprising: a P-type thin film resistor formed of a P-type semiconductor thin film; and an N-type thin film resistor formed of an N-type semiconductor thin film connected in serial or parallel with the P-type thin film resistor so that a stress-induced resistance variation in one of the thin film resistors is canceled by an inverse stress-induced resistance variation in the other thin film resistor.

2. A semiconductor device according to claim 1; wherein the thin film resistor element comprises a resistor of a bleeder resistor circuit having a plurality of resistors each comprising one thin film resistor element, a resistance value of each of the thin film resistor elements being formed by a combination of the P-type thin film resistor and the N-type thin film resistor.

3. A semiconductor device according to claim 1; wherein the thin film resistor element is formed of polysilicon.

4. A semiconductor device according to claim 2; wherein the thin film resistor element is formed of polysilicon.

5. A semiconductor device according to claim 1; wherein the P-type thin film resistor is arranged in sufficiently close proximity to the N-type thin film resistor so that a stress-induced increase in resistance in one of the P-type and N-type thin film resistors is canceled by a stress-induced decrease in resistance in the other of the P-type and N-type thin film resistors.

6. A voltage detector comprising: a power source for producing a power source signal; a reference voltage generating circuit for generating a reference voltage; a voltage divider circuit having a plurality of resistors for dividing the power source signal and producing a divided power source signal; and an error amplifier for inputting the reference voltage and the divided power source signal and outputting an error signal based upon a comparison therebetween; wherein the voltage divider circuit is formed of a plurality of the thin film resistor elements according to claim 1.

7. A thin film resistor element comprising: a P-type thin film resistor formed of a P-type semiconductor thin film; and an N-type thin film resistor formed of an N-type semiconductor thin film and arranged in sufficiently close proximity to the P-type thin film resistor so that a stress-induced increase in resistance in one of the P-type and N-type thin film resistors is canceled by a stress-induced decrease in resistance in the other of the P-type and N-type thin film resistors.

8. A thin film resistor element according to claim 7; wherein the P-type thin film resistor is connected in serial or parallel with the N-type thin film resistor.

9. A thin film resistor element according to claim 7; wherein the P-type thin film resistor and the N-type thin film resistor are formed of polysilicon thin films.

10. A thin film resistor element according to claim 7; wherein the thin film resistor element comprises a resistor of a bleeder resistor circuit having a plurality of resistors each comprising one thin film resistor element, a resistance value of each of the thin film resistor elements being formed by a combination of the P-type thin film resistor and the N-type thin film resistor.

11. A resistor circuit comprising: a first resistor having a first conductivity type; and a second resistor having a second conductivity type opposite the first conductivity type connected in series or parallel to the first resistor and arranged in sufficiently close proximity to first resistor so that a stress-induced increase in resistance in one of the resistors is canceled by a stress-induced decrease in resistance in the other resistor.

12. A resistor circuit according to claim 11; wherein the first resistor comprises a P-type thin film resistor formed of a P-type thin film on a semiconductor substrate and the second resistor comprises an N-type thin film resistor formed of an N-type thin film on the semiconductor substrate adjacent the P-type thin film resistor.

13. A resistor circuit according to claim 12; wherein the P-type and N-type thin films are formed of polysilicon.

* * * * *